United States Patent
Shen et al.

(10) Patent No.: US 7,695,761 B1
(45) Date of Patent: Apr. 13, 2010

(54) METHOD AND SYSTEM FOR PROVIDING A SPIN TUNNELING MAGNETIC ELEMENT HAVING A CRYSTALLINE BARRIER LAYER

(75) Inventors: Yong Shen, Saratoga, CA (US); Qunwen Leng, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 253 days.

(21) Appl. No.: 11/643,446

(22) Filed: Dec. 21, 2006

(51) Int. Cl.
B05D 5/12 (2006.01)
(52) U.S. Cl. ............... 427/127; 360/324.12; 360/324.2
(58) Field of Classification Search ................ 427/127, 427/128, 130, 131, 132
See application file for complete search history.

(56) References Cited

U.S. PATENT DOCUMENTS

| | | | |
|---|---|---|---|
| 5,764,445 A * | 6/1998 | Torng et al. ............ 360/327.32 |
| 6,322,640 B1 | 11/2001 | Xiao et al. | |
| 6,347,049 B1 | 2/2002 | Childress et al. | |
| 6,413,325 B1 | 7/2002 | Shimazawa et al. | |
| 6,680,831 B2 | 1/2004 | Hiramoto et al. | |
| 6,690,163 B1 | 2/2004 | Hoshiya et al. | |
| 6,724,581 B2 | 4/2004 | Westwood | |
| 6,751,073 B2 | 6/2004 | Hasegawa | |
| 6,791,792 B2 | 9/2004 | Takahashi | |
| 6,819,532 B2 | 11/2004 | Kamijo | |
| 6,841,395 B2 | 1/2005 | Linn et al. | |
| 6,848,169 B2 | 2/2005 | Shin et al. | |
| 6,876,507 B2 | 4/2005 | Chen et al. | |
| 6,937,434 B2 | 8/2005 | Takahashi | |
| 7,077,929 B2 * | 7/2006 | You et al. ............. 156/345.32 |
| 7,211,340 B2 * | 5/2007 | Nolan .................. 428/831.2 |
| 7,230,264 B2 | 6/2007 | Thean et al. | |
| 7,230,265 B2 | 6/2007 | Kaiser et al. | |
| 7,241,631 B2 | 7/2007 | Huai et al. | |
| 7,256,971 B2 | 8/2007 | Horng et al. | |
| 7,270,896 B2 | 9/2007 | Parkin | |
| 7,349,187 B2 | 3/2008 | Parkin | |
| 7,351,483 B2 | 4/2008 | Parkin | |
| 7,423,849 B2 * | 9/2008 | Gill ....................... 360/324.11 |
| 7,443,639 B2 | 10/2008 | Parkin | |
| 7,488,609 B1 | 2/2009 | Lin et al. | |
| 2003/0179071 A1 | 9/2003 | Hiramoto et al. | |
| 2004/0056288 A1 * | 3/2004 | Fukuzumi ................ 257/295 |
| 2004/0219772 A1 * | 11/2004 | You et al. ................ 438/585 |

(Continued)

OTHER PUBLICATIONS

Tsunekawa, et al., "Giant tunneling magnetoresistance effect in low-resistance CoFeB/MgO(001)/CoFeB magnetic tunnel junctions for read-head applications", Applied Physics Letters 87, 072503, 3 pages, 2005.

(Continued)

*Primary Examiner*—Timothy H Meeks
*Assistant Examiner*—Joseph Miller, Jr.

(57) ABSTRACT

The method and system for providing a spin tunneling element are disclosed. The method and system include depositing a pinned layer, a barrier layer, and a free layer. The barrier layer has a first crystal structure and a texture. The free layer includes a first ferromagnetic layer and a second ferromagnetic layer. The first ferromagnetic is adjacent to the second ferromagnetic layer and between the second ferromagnetic layer and the barrier layer. The first ferromagnetic layer has the first crystal structure and the texture, while the second ferromagnetic layer has a second crystal structure different from the first crystal structure.

12 Claims, 6 Drawing Sheets

U.S. PATENT DOCUMENTS

| | | |
|---|---|---|
| 2005/0009211 A1 | 1/2005 | Linn et al. |
| 2005/0120544 A1 | 6/2005 | Lam |
| 2006/0071287 A1 | 4/2006 | Yuasa et al. |
| 2006/0093862 A1 | 5/2006 | Parkin |
| 2006/0141640 A1 | 6/2006 | Huai et al. |
| 2006/0180839 A1 | 8/2006 | Fukumoto et al. |
| 2006/0209590 A1 | 9/2006 | Guo et al. |
| 2007/0074317 A1 | 3/2007 | Pakala et al. |
| 2007/0111332 A1 | 5/2007 | Zhao et al. |
| 2007/0139827 A1 | 6/2007 | Gao et al. |
| 2007/0188945 A1 | 8/2007 | Fuji et al. |
| 2007/0228501 A1 | 10/2007 | Nakamura et al. |
| 2007/0243639 A1 | 10/2007 | Pietambaram et al. |
| 2008/0030907 A1 | 2/2008 | Nakabayashi et al. |
| 2008/0080101 A1 | 4/2008 | Mauri et al. |
| 2008/0124454 A1 | 5/2008 | Djayaprawira et al. |
| 2008/0179699 A1 | 7/2008 | Horng et al. |
| 2008/0299679 A1 | 12/2008 | Zhao et al. |
| 2009/0027810 A1 | 1/2009 | Horng et al. |

OTHER PUBLICATIONS

Read, et al., "X-ray photoemission study of CoFeB/MgO thin film bilayers", Applied Physics Letters 90, 132503, 3 pages, 2007.

Djayaprawira, et al., "230% room-temperature magnetoresistance in CoFeB/MgO/CoFeB magnetic tunnel junctions", Applied Physics Letters 86, 092502, 3 pages, 2005.

Tsunekawa, et al., "Huge Magnetoresistance and Low Junction Resistance in Magnetic Tunnel Junctions with Crystalline MgO Barrier", IEEE Transactions on Magnetics, vol. 42, No. 2, pp. 103-107. Feb. 2006.

Park, et al., "Annealing effects on structural and transport properties of rf-sputtered CoFeB/MgO/CoFeB magnetic tunnel junctions", Journal of Applied Physics 99, 08A901, 3 pages, 2006.

Park, et al., "Effect of Adjacent Layers on Crystallization and Magnetoresistance in CoFeB/MgO/CoFeB Magnetic Tunnel Junction", IEEE Transactions on Magnetics, vol. 42, No. 10, pp. 2639-2641, Oct. 2006.

Neil Smith, "Fluctuation-dissipation considerations for phenomenological damping models for ferromagnetic thin film," Journal of Applied Physics, Oct. 1, 2002, vol. 92, No. 7, pp. 3877-3885.

Jian-Gang Zhu, "Magnetization Dynamics: Thermal Driven Noise in Magnetoresistive Sensors," Handbook of Magnetism and Advanced Magnetic Material, John Wiley & Sons, Ltd., 2007, 16 pages.

S.W. Sun, et al., "Possible giant surface magnetostriction in amorphous Co76Cr4B20", J. Appl. Phys. 69 (Abstract), Apr. 15, 1991, 5218.

\* cited by examiner

METHOD AND SYSTEM FOR PROVIDING A SPIN TUNNELING MAGNETIC ELEMENT HAVING A CRYSTALLINE BARRIER LAYER

FIELD OF THE INVENTION

The present invention relates to magnetic recording technology, and more particularly to a method and system for providing a spin tunneling element having a crystalline barrier layer.

BACKGROUND

Figure 1:
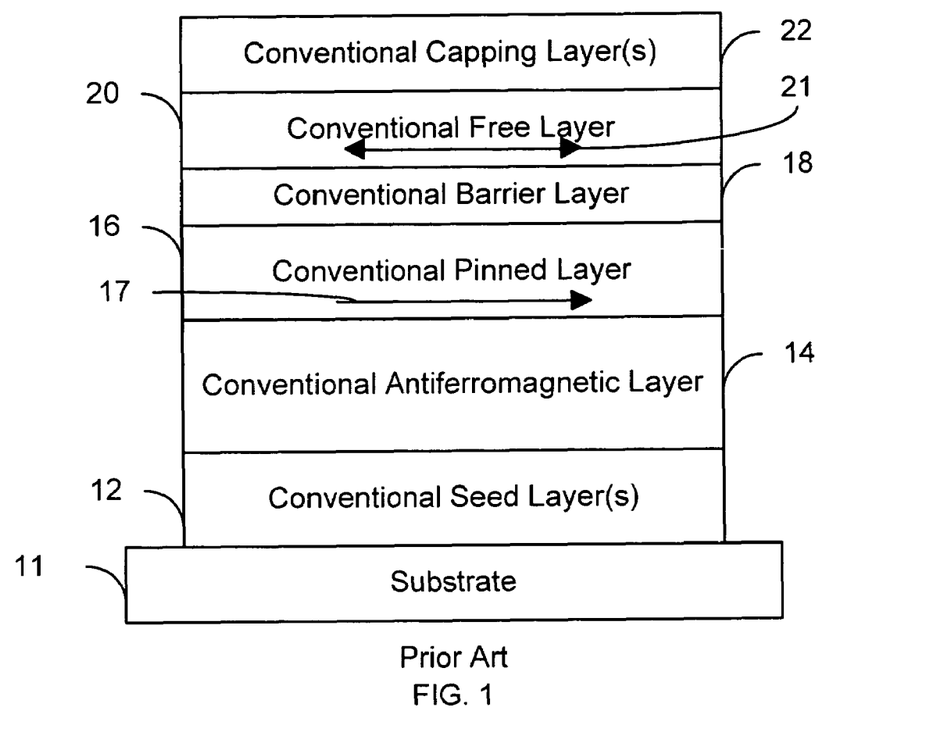
FIG. 1 depicts a conventional method 10 for fabricating a magnetoresistive device.

FIG. 1 depicts a conventional spin tunneling element 10. The conventional spin tunneling element 10 typically resides on a substrate 11 on which seed layer(s) 11 have been formed. The conventional spin tunneling element 10 includes a conventional antiferromagnetic (AFM) layer 14, a conventional pinned layer 16 having a magnetization 17, a conventional barrier layer 18, a conventional free layer 20 having a magnetization 21, and a conventional capping layer 22. In addition, analogous conventional spin tunneling elements (not shown) may include a synthetic free layer, a synthetic pinned layer, or both. A synthetic layer typically includes two ferromagnetic layers antiferromagnetically coupled through a thin conductive layer, such as a Ru layer. The magnetization 17 of the conventional pinned layer 16 is fixed, or pinned, in a particular direction, typically by an exchange-bias interaction with the AFM layer 14. However, the magnetization 21 of the free layer 20 may move, or switch, in response to an external field.

Such a conventional spin tunneling element 10 can be used as a sensor in tunneling magnetoresistive heads. In such an application, the magnetization 21 of the free layer 20 changes in response to an external field. The change in the magnetization 21 results in a different resistance of the conventional spin tunneling element 10. When the magnetization 21 of the conventional free layer 20 is parallel to the magnetization 17 of the conventional pinned layer 16, the resistance of the conventional spin tunneling element 10 is at a minimum. When the magnetization 21 of the conventional free layer 20 is antiparallel to the magnetization 17 of the conventional pinned layer 16, the resistance of the conventional spin tunneling element 10 is at a maximum. Consequently, the change in the magnetization 21, and thus data in a recording media (not shown), may be determined based on the resistance of the conventional spin tunneling element 10.

To be suitable for use as a sensor in a read head, the conventional spin tunneling 10 is desired to have certain properties. A large percentage change in resistance ($\Delta R/R$) and an appropriate Ra is desired for a large signal. The free layer 20 is desired to be soft, having a coercivity of not more than five Oersted. In addition, a low magnetostriction of $\lambda_s$ being not more than $1.0 \times 10^{-6}$ (or not less than $-1.0 \times 10^{-6}$) is desired. In addition, a low interlayer exchange coupling, $H_{in}$, of not more than fifty Oersted is desired to help ensure that the magnetization of the free layer 20 is free to respond to an external field.

The conventional spin tunneling element 10 may use crystalline MgO as the conventional barrier layer 18 and CoFeB for the free layer 20. For such conventional spin tunneling elements 10, the high $\Delta R/R$ and low Ra may be achieved if the MgO has a [100] texture. As used herein, a specific texture indicates that the layer has a dominant orientation. Thus, the conventional barrier layer 18 of MgO having a [100] texture means that the conventional barrier layer 18 has a dominant [100] orientation. However, for such a conventional spin tunneling element 10, the CoFeB free layer 20 may have poor soft magnetic performance. In particular, the CoFeB free layer 20 may exhibit high magnetostriction and interlayer exchange coupling. For example, the CoFeB free layer 20 may have a magnetostriction of greater than $4.5 \times 10^{-6}$ and an interlayer exchange coupling of greater than forty Oersted. Consequently, a head using the conventional spin tunneling element 10 may not be sufficiently stable.

Alternatively, the conventional free layer 20 may be a bilayer of CoFeB and NiFe. The NiFe layer is used to improve the soft magnetic performance of the conventional free layer 18. However the use of such a multilayer for the conventional free layer 18 significantly reduces the $\Delta R/R$, and thus the signal. For example, the magnetoresistance may drop from approximately 120% to approximately 45%. When NiFe is added to CoFeB during fabrication, CoFeB is transformed from an amorphous structure to a face-centered cubic (FCC) structure during annealing of the conventional free layer 20. This change in the CoFeB layer results in a lower magnetoresistance. Consequently, the signal in a head using such a conventional free layer 20 is reduced.

Accordingly, what is needed is an improved system and method for providing a spin tunneling element that may be suitable for use in a read head.

SUMMARY

The method and system for providing a spin tunneling element are disclosed. The method and system include depositing a pinned layer, a barrier layer, and a free layer. The barrier layer has a first crystal structure and a texture. The free layer includes a first ferromagnetic layer and a second ferromagnetic layer. The first ferromagnetic is adjacent to the second ferromagnetic layer and between the second ferromagnetic layer and the barrier layer. The first ferromagnetic layer has the first crystal structure and the texture, while the second ferromagnetic layer has a second crystal structure different from the first crystal structure.

DETAILED DESCRIPTION OF THE PREFERRED EMBODIMENTS

Figure 2:
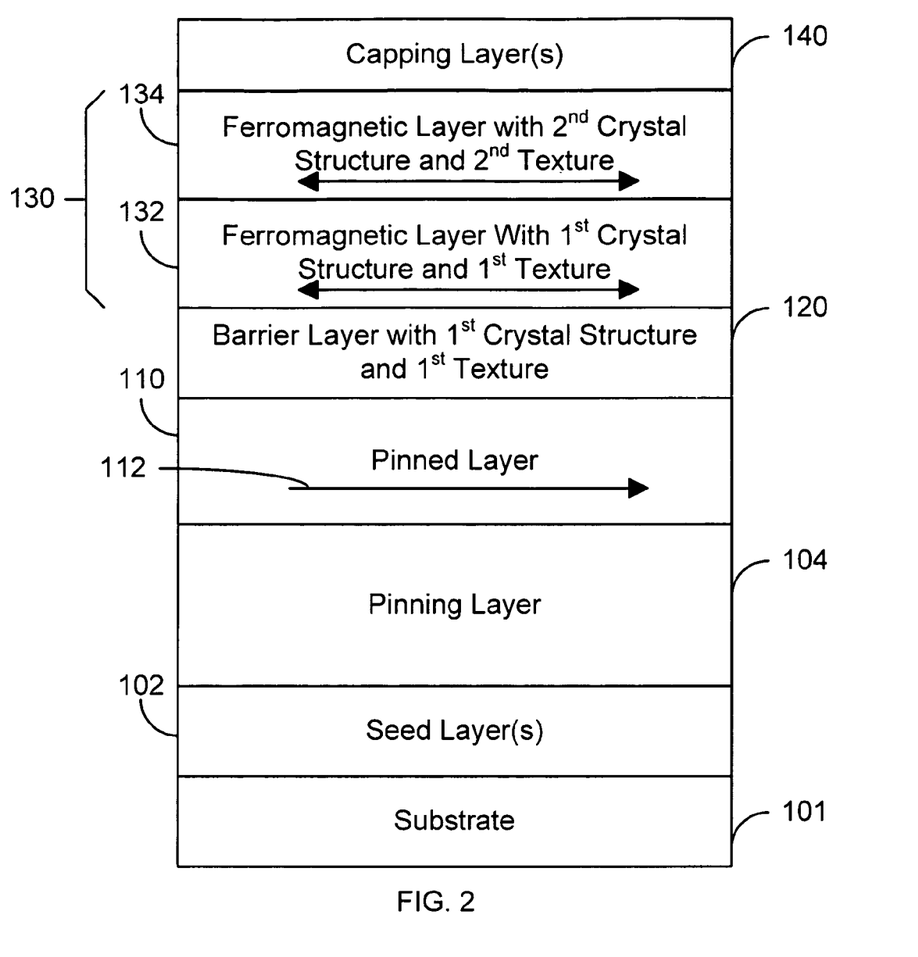
FIG. 2 is a diagram depicting an exemplary embodiment of a spin tunneling element.

FIG. 2 is a diagram depicting an exemplary embodiment of a spin tunneling element 100. The spin tunneling element 100 includes at least a pinned layer 110, a barrier layer 120, and a free layer 130. In a preferred embodiment, the magnetization 112 of the pinned layer 110 is relatively fixed, or pinned, in place using a pinning layer 104. The pinning layer 104 is preferably an antiferromagnetic layer grown on seed layer(s) 102. Also depicted in FIG. 2 is the substrate 101 and optional capping layer 140. The spin tunneling element 100 is preferably part of a transducer in a head that may be a read head or merged head.

The pinned layer 110 is preferably formed of CoFeB. However, other materials may be used. In addition, the pinned layer 110 is depicted as a single layer. However, in another embodiment, multiple layers may be used. For example, the pinned layer 100 may be a synthetic pinned layer including two ferromagnetic layers separated by a nonmagnetic spacer layer.

The barrier layer 120 is a layer through which charge carriers may tunnel. For example, the barrier layer 120 may be an insulator and/or may selectively allow tunneling of charge carriers based upon the spin state of the charge carriers. The barrier layer 120 is also crystalline and has a texture. Thus, as depicted in FIG. 2, the barrier layer 120 has a first crystal structure and a first texture. As used herein a crystal structure means that a majority (more than half) of the layer has the crystal structure. For example, stating that a layer is face-centered cubic (FCC) means that a majority of the layer is FCC. The entire layer need not be FCC. Similarly, as used herein a texture means that a particular orientation is dominant for the layer. For example, stating that a layer has a [100] texture means that the dominant orientation for the layer is a (100) orientation. In a preferred embodiment, the barrier layer 120 includes MgO. For example, the barrier layer 120 may be MgO or MgOX, where X is a nonmagnetic material. Such a layer may be fabricated by including a nonmagnetic underlayer (not shown) and/or capping layer (not shown). For example, an Mg underlayer and/or capping layer may be utilized in conjunction with an MgO layer. In addition, X may also include dopants such as nitrogen. Also in a preferred embodiment, the MgO is body-centered cubic (BCC) in structure and has a [100] or [200] texture.

The free layer 130 includes two layers 132 and 134. The layers 132 and 134 are preferably ferromagnetic, adjacent, and magnetically coupled. The ferromagnetic layer 132 closest to the barrier layer 120 shares the first crystal structure and first texture of the barrier layer 120. Thus, for an MgO barrier layer 120, the ferromagnetic layer 132 is preferably BCC in structure and has a [100] texture. Thus, the ferromagnetic layer 132 is preferably predominantly BCC and has [100] as the dominant orientation. The ferromagnetic layer 132 preferably includes CoFe. In a preferred embodiment, the ferromagnetic layer 132 is a CoFeB layer, with B having a concentration of at least ten and not more than fifty atomic percent. In a preferred embodiment, the ferromagnetic layer 132 has approximately thirty atomic percent B. The CoFe preferably has a 1:1 to 3:1 ratio of Co to Fe. For example, the ferromagnetic layer may be $Co_{40}Fe_{40}B_{20}$ or $Co_{60}Fe_{20}B_{20}$. However, in another embodiment, the ferromagnetic layer 132 may include other materials. For example, in one embodiment, the ferromagnetic layer 132 includes doped CoFeB doped with other impurities. Because CoFeB is preferred, the ferromagnetic layer 132 is hereinafter termed the CoFeB layer 132.

The adjacent ferromagnetic layer 134 has a second crystal structure and a second texture. In a preferred embodiment, the second crystal structure is FCC. Also in a preferred embodiment, the ferromagnetic layer 134 includes NiFe. In a preferred embodiment, the NiFe in the ferromagnetic layer 134 has at least thirteen atomic percent and not more than twenty-seven atomic percent Fe. In another embodiment, the ferromagnetic layer 134 may include other soft magnetic materials. For example, the ferromagnetic layer 134 may include NiFeX, where X includes at least one of Cr, Rh, Ru, and Nb. However, because NiFe is preferred, the ferromagnetic layer 134 is hereinafter termed the NiFe layer 134.

The NiFe layer 134 is utilized to improve the soft magnetic properties of the CoFeB layer 132. Because of the interaction with the NiFe layer 134, the CoFeB layer 132 may have sufficient soft magnetic properties. In particular, a coercivity of not more than five Oersted and a low magnetostriction $\lambda_s$ of not more than $1.0 \times 10^{-6}$ (or not less than $-1.0 \times 10^{-6}$) may be achieved. In addition, a low interlayer exchange coupling of not more than fifty Oersted may be attained for the free layer 130 of the layers 132. Consequently, the spin tunneling element 100 may be suitable for use in a read head. In addition, the CoFeB layer 132 remains BCC, particularly with a [100] texture. Consequently, magnetoresistance for the spin tunneling element 100 may remain large. If the spin tunneling element 100 is utilized as a read sensor in a transducer, a high signal may be provided.

Figure 3:
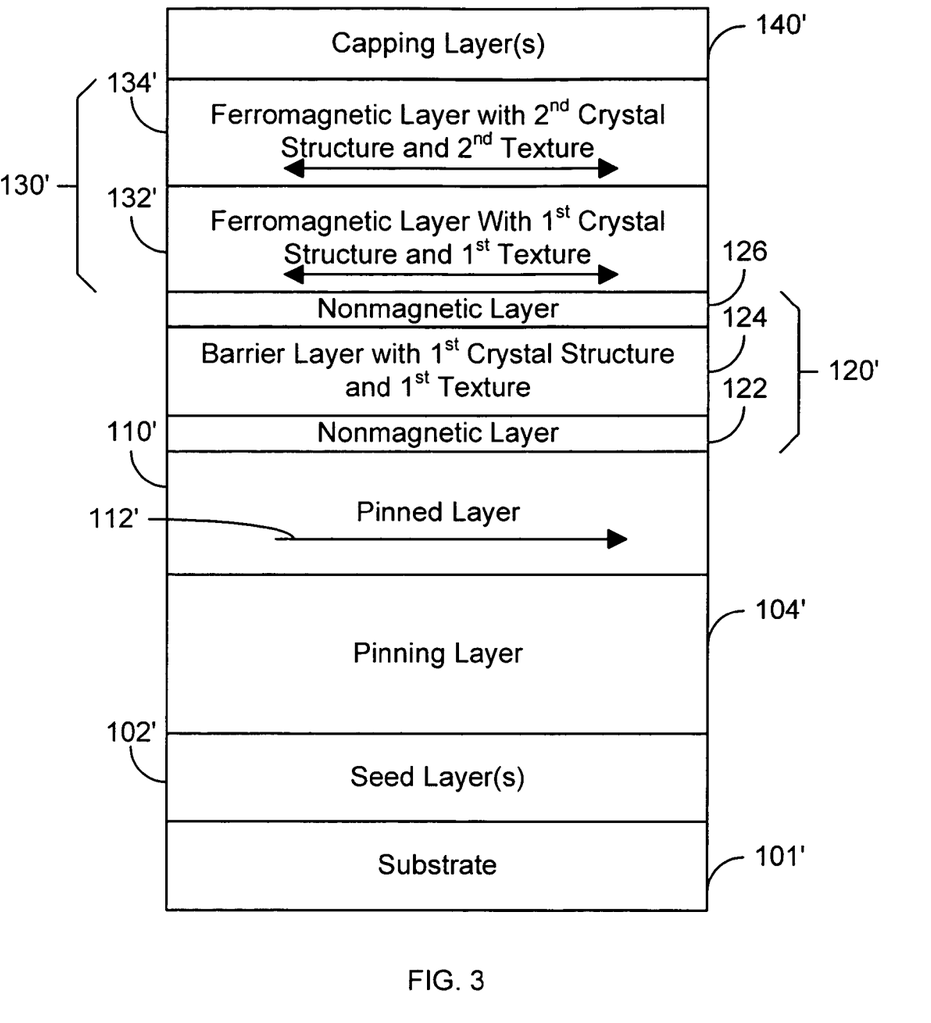
FIG. 3 is a diagram depicting another exemplary embodiment of a spin tunneling element.

FIG. 3 is a diagram depicting another exemplary embodiment of a spin tunneling element 100'. The spin tunneling element 100' is analogous to the spin tunneling element 100. Consequently, the components depicted are labeled similarly. The spin tunneling element 100' thus includes a pinning layer 104' on seed layers 102' and substrate 101', a pinned layer 110', a barrier layer 120', a free layer 130', and an optional capping layer 140'. The pinned layer 110' is depicted as a single layer, but might include multiple layers. The pinned layer 110' preferably include CoFeB layer. The free layer 130' includes layers 132' and 134' analogous to the layers 132 and 134 depicted in FIG. 2. The layer 132' of the free layer 130' has a crystal structure and texture matching that of the barrier layer 120'. The ferromagnetic layer 132' thus preferably has a BCC crystal structure and a [100] texture. The ferromagnetic layer 134' is preferably NiFe having a FCC crystal structure. In one embodiment, the ferromagnetic layer 132' includes CoFe. In a preferred embodiment, the ferromagnetic layer 132' is a CoFeB layer.

In addition, the barrier layer 120' includes layers 122, 124, and 126. The layers 122 and 126 are nonmagnetic, for example including Mg. The layer 124 is a crystalline insulator having a texture, preferably MgO with a [100] texture. In addition, the barrier layer 120' could be doped, for example using nitrogen impurities.

The magnetic element 100' shares the benefits of the magnetic element 100. In particular, the magnetic element 100' may have improved soft properties of the free layer 130' without substantially reducing magnetoresistance.

Figure 4:
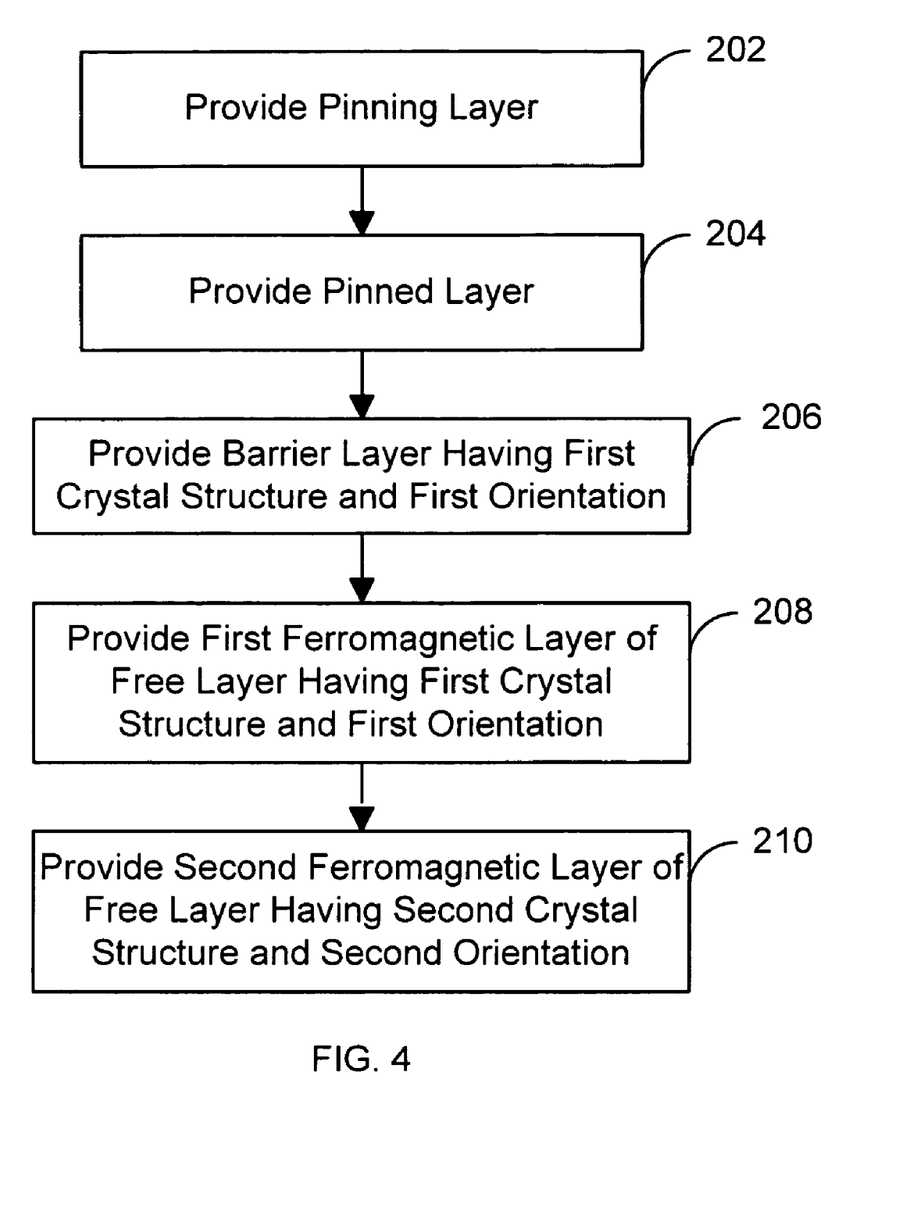
FIG. 4 is a flow chart depicting an exemplary embodiment of a method for fabricating a spin tunneling element.

FIG. 4 is a flow chart depicting an exemplary embodiment of a method 200 for fabricating a spin tunneling element. For clarity, the method 200 is described in the context of the spin tunneling element 100. However, one of ordinary skill in the art will readily recognize that the method 200 could be used to provide other spin tunneling elements including, but not limited to, the spin tunneling element 100'. In addition, for simplicity, the method 200 is described in the context of steps having a particular order. One of ordinary skill in the art will recognize that the steps could include multiple sub-steps, the steps might be performed in another order, and that additional and/or different steps not inconsistent with the method, system, and spin tunneling elements described herein could be used.

The pinning layer 104 is provided, via step 202. In one embodiment, step 202 includes depositing an AFM layer and annealing the AFM layer in a field having a desired direction and magnitude. In a preferred embodiment, the pinning layer 104 is provided on seed layer(s) 102, which help to ensure the pinning layer 104 has the desired crystal structure and properties. The pinned layer 110 is provided, via step 204. In one embodiment, step 204 includes depositing a CoFe layer. The crystalline barrier layer 120 having the desired texture is provided, via step 206. Step 206 preferably includes depositing an MgO layer that has a [100] texture. If the spin tunneling element 100' is provided, then step 206 would also provide the layers 122, 124, and 126. Steps 208 and 210 are used to provide the free layer 130. The first ferromagnetic layer 132 having the first crystal structure and texture is provided, via step 208. Step 208 preferably includes depositing a CoFe layer 132 on the underlying barrier layer 120. The second ferromagnetic layer 134 of the free layer 130 having a second crystal structure and second texture is provided such that the first crystal structure and first texture of the ferromagnetic layer 132 are preserved, via step 210. In a preferred embodiment, step 210 includes performing a rapid thermal anneal on the spin tunneling element 100 such that the surface of the ferromagnetic layer 132 is prepared for growth of the ferromagnetic layer 134. However, the ferromagnetic layer 132 still retains its first crystal structure and first texture. Stated differently, the dominant crystal structure and orientation of the ferromagnetic layer 132 do not change. For a CoFeB ferromagnetic layer 132, for example, the majority of the ferromagnetic layer 132 still has a FCC crystal structure and a [100] texture. In an alternate embodiment, the second ferromagnetic layer 210 could be provided through a high temperature deposition. In such a deposition, the second ferromagnetic layer 210 would have its desired crystal structure and texture (if any), while the first ferromagnetic layer retained its crystal structure and texture. Alternatively, the second ferromagnetic layer 134 could be deposited and annealed in a manner which allows each of the ferromagnetic layers 132 and 134 to have their desired crystal structure and texture. For example, an performing an additional anneal at a temperature of not more than three hundred sixty degrees Centigrade in a magnetic field of at least five thousand and not more than fifteen thousand Gauss might be used in step 210. Thus, using steps 208 and 210 the free layer 130 having ferromagnetic layers 132 and 134 with different crystal structure and different textures but which are magnetically coupled may be provided.

Using the method 200, the spin tunneling elements 100 and 100' may be provided. Consequently, the benefits of the spin tunneling elements 100 and 100' may be achieved.

Figure 5:
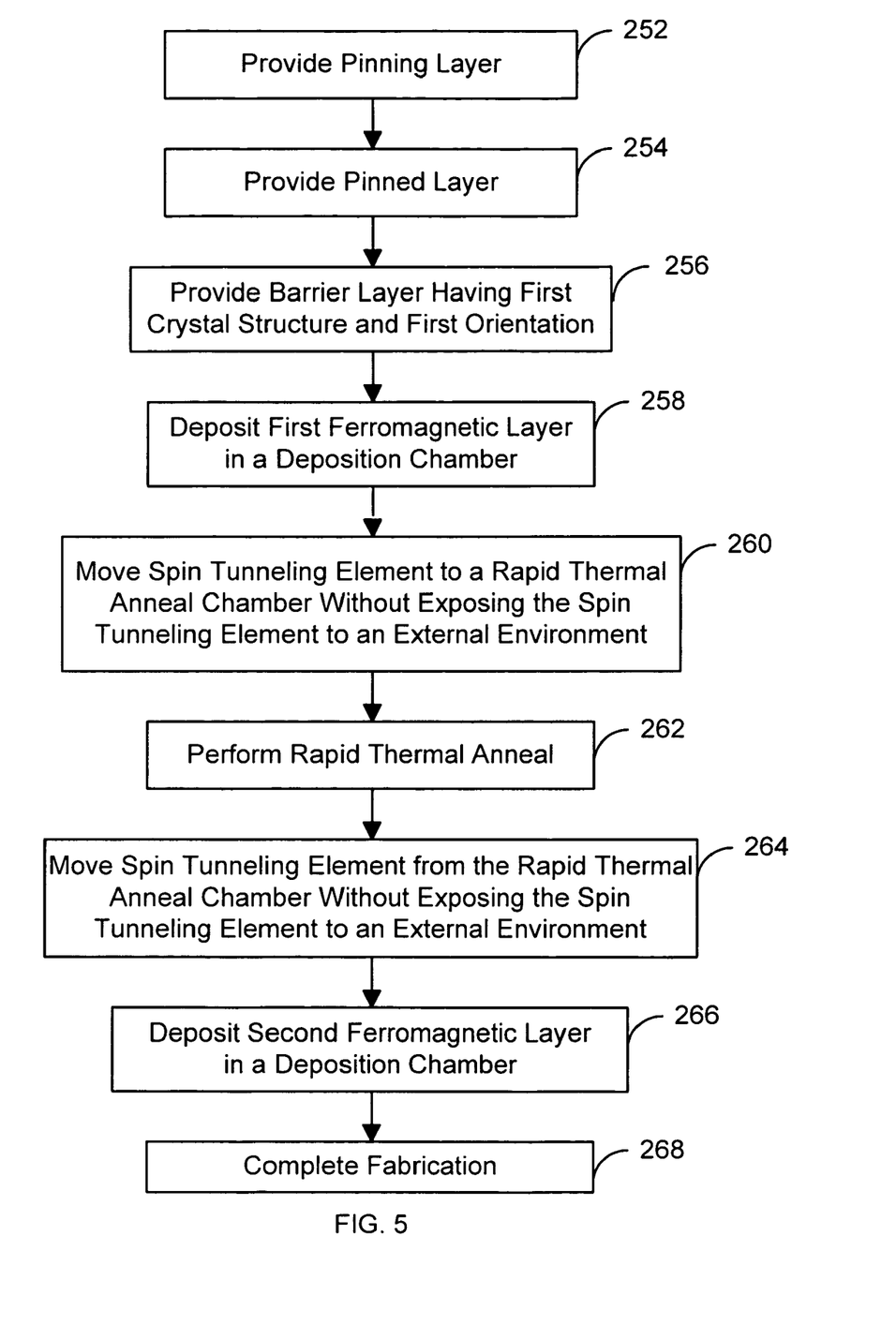
FIG. 5 is a flow chart depicting another exemplary embodiment of a method for fabricating a magnetoresistive device using a single layer mask.

FIG. 5 is a flow chart depicting another exemplary embodiment of a method 250 for fabricating a magnetoresistive device using a single layer mask. For clarity, the method 250 is described in the context of the spin tunneling element 100. However, one of ordinary skill in the art will readily recognize that the method 250 could be used to provide other spin tunneling elements including, but not limited to, the spin tunneling element 100'. In addition, for simplicity, the method 250 is described in the context of steps having a particular order. One of ordinary skill in the art will recognize that the steps could include multiple sub-steps, the steps might be performed in another order, and that additional and/or different steps not inconsistent with the method, system, and spin tunneling elements described herein could be used.

Referring to FIGS. 2 and 5, the pinning layer 104 is provided, via step 252. In one embodiment, step 252 includes depositing an AFM layer and annealing the AFM layer in a field having a desired direction and magnitude. In a preferred embodiment, the pinning layer 104 is provided on seed layer(s) 102, which help to ensure the pinning layer 104 has the desired crystal structure and properties. The pinned layer 110 is provided, via step 254. In one embodiment, step 254 includes depositing a CoFe layer. The crystalline barrier layer 120 having the desired texture is provided, via step 256. Step 256 preferably includes depositing an MgO layer that has a [100] texture. If the spin tunneling element 100' is provided, then step 256 would also provide the layers 122, 124, and 126.

The first ferromagnetic layer 132 is deposited, via step 258. In a preferred embodiment, the first ferromagnetic layer 132 is deposited in a deposition chamber. Also in a preferred embodiment, the first ferromagnetic layer 132 includes CoFe and may be a CoFeB layer. The spin tunneling element 100 is moved to a rapid thermal anneal chamber without exposing the spin tunneling element 100 to an external environment, via step 260. In a preferred embodiment, step 260 is performed using a transfer station.

A rapid thermal anneal is performed on the spin tunneling element 100, particularly the first ferromagnetic layer 132, via step 262. Thus, the surface of the first ferromagnetic layer 132 may be prepared such that the second ferromagnetic layer 134 having the desired structure may be deposited. However, the rapid thermal anneal performed in step 262 does not alter the crystal structure or the texture of the ferromagnetic layer 132. A majority of the ferromagnetic layer 132, therefore, retains the first crystal structure and texture. For a CoFeB layer 132, a majority of the layer 132 still has a BCC crystal structure and [100] texture.

The spin tunneling element 100 is moved from a rapid thermal anneal chamber to a deposition chamber without exposing the spin tunneling element 100 to an external environment, via step 264. In a preferred embodiment, step 264 is performed using a transfer station. The second ferromagnetic layer 134 is deposited, via step 266. In a preferred embodiment, step 266 includes depositing a NiFe layer that has a FCC crystal structure. Fabrication of the spin tunneling element 100 is completed, via step 268. Step 268 may include, for example, depositing the capping layer(s) 140. In addition, other procedures such as lapping the spin tunneling element 100 may also be completed to prepare the spin tunneling element 100 for use, for example as a read sensor.

Using the method 250, the spin tunneling elements 100 and 100' may be provided. Consequently, the benefits of the spin tunneling elements 100 and 100' may be achieved.

Figure 6:
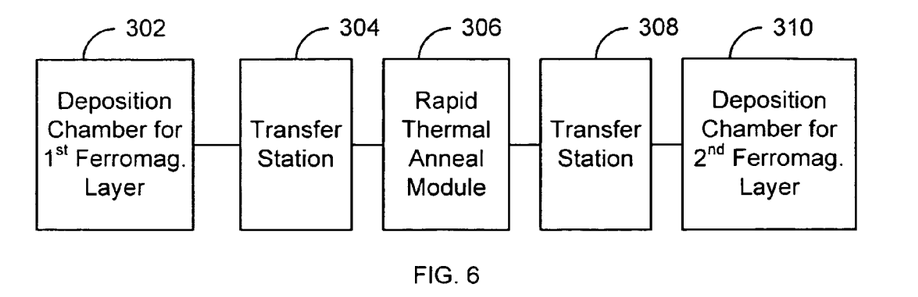
FIG. 6 depicts an exemplary embodiment of a system for fabricating one embodiment of a spin tunneling element.

FIG. 6 depicts an exemplary embodiment of a system 300 for fabricating one embodiment of a spin tunneling element. Although the system 300 is shown as linear in configuration, in an alternate embodiment, another configuration may be used. The system 300 is described in connection with the method 250. One of ordinary skill in the art will recognize, however, that the system 300 may be used separately. The system 300 is also described in the context of the spin tunneling elements 100/100'. However, one of ordinary skill in the art will readily recognize that the system 300 may be used to form other spin tunneling elements 100/100'.

Referring to FIGS. 2, 3, 5, and 6, the system 300 is used to provide the free layer 130/130'. The system 300 includes deposition chambers 302 and 310, transfer stations 304 and 308, and rapid thermal anneal module 306. The first ferromagnetic layer 132/132' is deposited in the deposition chamber 302 using step 258. Using the transfer station 304, step 260 is performed. Thus, the spin tunneling element 100/100' is moved to the rapid thermal anneal module 306 without exposing the spin tunneling element 100/100' to an external environment. The rapid thermal anneal module 306 is used to perform a rapid thermal anneal on the spin tunneling element 100/100' in step 262. Thus, the surface of the first ferromagnetic layer 132/132' may be prepared for deposition of the second ferromagnetic layer 134/134' without altering the crystal structure or the texture of the ferromagnetic layer 132/132'. A majority of the ferromagnetic layer 132/132', therefore, retains the first crystal structure and texture through the rapid thermal anneal performed using the module 306. For a CoFeB layer 132, a majority of the layer 132 still has a BCC crystal structure and [100] texture.

The transfer station 308 is used to move the spin tunneling element 100/100' from the rapid thermal anneal module 306 to the deposition chamber 310 without exposing the spin tunneling element 100/100' to an external environment. Thus, step 264 is preferably performed using the transfer station 308. Although a second transfer station 308 is used, in an alternate embodiment, the transfer station 304 may be used to move the spin tunneling element 100/100' from the rapid thermal anneal module 306. The second ferromagnetic layer 134/134' is deposited in the deposition chamber 310. In a preferred embodiment, a NiFe layer that has a FCC crystal structure is deposited in the deposition chamber 310. The spin tunneling element 100/100' may then be moved to another deposition chamber and/or further down the line for completion of the spin tunneling element 100/100'.

Using the system 300, particularly in connection with the methods 250 and/or 200, the spin tunneling elements 100 and 100' may be provided. Consequently, the benefits of the spin tunneling elements 100 and 100' may be achieved.

The invention claimed is:

1. A method for providing a spin tunneling element comprising:
   providing a pinned layer;
   providing a barrier layer having a first crystal structure, and having a texture; and
   providing a free layer having a first ferromagnetic layer and a second ferromagnetic layer, the first ferromagnetic layer being adjacent to the second ferromagnetic layer and between the second ferromagnetic layer and the barrier layer, the first ferromagnetic layer having the first crystal structure and the texture, the second ferromagnetic layer having a second crystal structure different from the first crystal structure after fabrication of the spin tunneling junction is complete, the step of providing the free layer further including:
   depositing the first ferromagnetic layer having the first crystal structure and the texture;
   performing a rapid thermal anneal on the first ferromagnetic layer such that the first ferromagnetic layer retains the first crystal structure and the texture;
   depositing the second ferromagnetic layer having the second crystal structure after the rapid thermal anneal has been performed.

2. The method of claim 1 wherein the rapid thermal anneal performing and the second ferromagnetic layer depositing steps are provided without exposing the spin tunneling element to an external environment.

3. The method of claim 1 wherein the free layer providing further includes:
   performing an additional anneal at a temperature of not more than three hundred sixty degrees Centigrade in a magnetic field of at least five thousand and not more than fifteen thousand Gauss.

4. The method of claim 1 wherein the barrier layer includes MgO.

5. The method of claim 4 wherein the barrier layer includes MgOX, where X is a nonmagnetic material.

6. The method of claim 4 wherein the texture is [100].

7. The method of claim 4 wherein the first ferromagnetic layer includes CoFe.

8. The method of claim 7 wherein the second ferromagnetic layer includes NiFe.

9. The method of claim 1 wherein the first crystal structure is BCC.

10. The method of claim 9 wherein the second crystal structure is FCC.

11. The method of claim 1 wherein the free layer providing further includes:
    depositing the first ferromagnetic layer in a deposition chamber;
    moving the spin tunneling element from the deposition chamber to a rapid thermal anneal chamber without exposing the spin tunneling element to an external environment;
    performing the rapid thermal anneal on the first ferromagnetic layer in the rapid thermal anneal chamber;
    moving the spin tunneling element from the rapid thermal anneal chamber to the deposition chamber without exposing the spin tunneling element to the external environment; and
    depositing the second ferromagnetic layer after the rapid thermal anneal has been performed.

12. A method for providing a spin tunneling element comprising:
    providing a barrier layer, the barrier layer being insulating and including MgO, having a first crystal structure, and having a texture; and
    depositing a first ferromagnetic layer in a first deposition chamber, the first ferromagnetic layer including CoFe having the first crystal structure and the texture;
    using at least one transfer station to move the spin tunneling element from the deposition chamber to a rapid thermal anneal chamber without exposing the spin tunneling element to an external environment;
    performing a rapid thermal anneal on the first ferromagnetic layer in the rapid thermal anneal chamber without changing the crystal structure and texture of the first ferromagnetic layer;
    using the at least one transfer station to move the spin tunneling element from the rapid thermal anneal chamber to a second deposition chamber without exposing the spin tunneling element to the external environment; and
    depositing a second ferromagnetic layer in the second deposition chamber after the rapid thermal anneal has been performed, the second ferromagnetic layer include including NiFe.

* * * * *